United States Patent [19]

Komaki et al.

[11] Patent Number: 5,164,051
[45] Date of Patent: Nov. 17, 1992

[54] METHOD FOR VAPOR PHASE SYNTHESIS OF DIAMOND ON ELECTROCHEMICALLY TREATED SUBSTRATE

[75] Inventors: Kunio Komaki; Masaaki Yanagisawa, both of Tokyo, Japan

[73] Assignee: Showa Denko K. K., Tokyo, Japan

[21] Appl. No.: 700,168

[22] PCT Filed: Sep. 20, 1990

[86] PCT No.: PCT/JP90/01209
§ 371 Date: May 17, 1991
§ 102(e) Date: May 17, 1991

[87] PCT Pub. No.: WO91/04353
PCT Pub. Date: Apr. 4, 1991

[30] Foreign Application Priority Data

Sep. 22, 1989 [JP] Japan .................. 1-245200
Dec. 14, 1989 [JP] Japan .................. 1-322516

[51] Int. Cl.⁵ .................. B23H 9/00; C25F 3/22
[52] U.S. Cl. .................. 204/129.43; 204/129.46; 204/129.75; 204/192.15; 204/192.38; 204/DIG. 9; 427/249; 427/450; 427/560
[58] Field of Search .................. 204/192.38, 192.15, 204/192.16, 129.43, 129.35, DIG. 9, 129.75; 427/37, 39, 307, 248.1, 249; 156/DIG. 68

[56] References Cited

U.S. PATENT DOCUMENTS

| | | | |
|---|---|---|---|
| 4,348,263 | 9/1982 | Draper et al. | 204/192.15 X |
| 4,414,244 | 11/1983 | Timberlake et al. | 427/249 X |
| 4,507,184 | 3/1985 | Murata et al. | 204/129.35 |
| 4,851,254 | 7/1989 | Yamamoto et al. | 427/37 |
| 4,915,977 | 4/1990 | Okamoto et al. | 427/37 |
| 4,938,940 | 7/1990 | Hirose et al. | 427/249 X |
| 5,094,878 | 3/1992 | Yamamoto et al. | 427/37 |

FOREIGN PATENT DOCUMENTS

| | | |
|---|---|---|
| 60-86096 | 5/1985 | Japan . |
| 61-52363 | 3/1986 | Japan . |
| 62-67174 | 3/1987 | Japan . |
| 63-199870 | 8/1988 | Japan . |
| 1-119671 | 5/1989 | Japan . |
| 1-201475 | 8/1989 | Japan . |
| 1-203297 | 8/1989 | Japan . |
| 1077888 | 3/1983 | U.S.S.R. .................. 204/129.43 |

Primary Examiner—Donald R. Valentine
Attorney, Agent, or Firm—Oblon, Spivak, McClelland, Maier & Neustadt

[57] ABSTRACT

A diamond film of the vapor phase process is produced by a method which comprises a step of (1) electrolytically polishing the surface of a hard metal substrate with a pulse voltage or, after electrolytic polishing, further subjecting it to a scratching treatment with an abrasive powder or (2) electrolytically polishing the surface of a hard metal substrate with a constant voltage and thereafter subjecting it to a scratching treatment with an abrasive powder, thereby heightening the adhesive force of the surface of the substrate, and then effecting deposition of dense diamond of high adhesive strength by the vapor phase process on the substrate.

19 Claims, 1 Drawing Sheet

METHOD FOR VAPOR PHASE SYNTHESIS OF DIAMOND ON ELECTROCHEMICALLY TREATED SUBSTRATE

TECHNICAL FIELD

This invention relates to a method for the deposition of a diamond film on a hard metal substrate by the vapor phase diamond synthesis process for the manufacture of a cutting tool or the like and more particularly to a method for the deposition of dense and highly adhesive diamond on the substrate.

BACKGROUND ART

As methods of treatment to be employed in the deposition of a diamond film by the vapor phase process on a hard metal substrate for the purpose of enhancing adhesive force between the deposited diamond film and the substrate, etching with a chemical substance such as an acid or an alkali (48th Scientific Lecture Meeting, 18a-T-4, Japan Applied Physics Society), scratching treatment with diamond powder (48th Scientific Lecture Meeting, 18a-T-5, Japan Applied Physics Society), and etching in a specific gas containing an alcohol (Japanese Patent Public Disclosure HEI 1-145396), etc. have been known to the art.

However, when, for example, a tool manufactured by forming a diamond film on hard metal lathe tip treated by one of these methods is actually used in cutting, the diamond film quickly exfoliates from the tip. Thus adhesive strength of a practical level cannot be obtained.

When a diamond film is formed on a hard metal substrate by the conventional method of surface treatment, the adhesive strength between the substrate and the diamond film is not sufficient. When the hard metal substrate coated with the diamond film is used as in cutting with a lathe, for example, this cutting work has the problem of ready exfoliation of the diamond film.

An object of this invention is to provide a method for the deposition of a diamond film with high adhesive strength on a hard metal substrate by the vapor phase process for the synthesis of diamond.

DISCLOSURE OF INVENTION

As a result of their study in search of a way of enhancing adhesive strength between a deposited diamond film and a hard metal substrate, the present inventors found that it is advantageous to provide protuberances serving as anchors on the surface of the substrate, specifically that protuberances are readily produced when the substrate surface is subjected to electrochemical treatment, namely to electrolytic polishing with a pulse voltage, and that the adhesive strength of the diamond film to the substrate becomes high with increasing thickness, length, and density of these protuberances, and based on this knowledge, they accomplished the present invention.

Specifically, in the present invention, when the hard metal substrate is subjected to electrolytic polishing with a pulse voltage, the protuberances formed on the surface of the hard metal substrate can be varied in size and density proportionately to changes of frequency and pulse width of the pulse voltage applied to the substrate.

This invention further comprises scratching with an abrasive powder the hard metal substrate having protuberances produced by the aforementioned electrolytic polishing. The electrolytic polishing in this case may be performed with a constant voltage. When a diamond film is deposited by the vapor phase process on the surface of a hard metal substrate treated by the method just mentioned, there is obtained a composite having the diamond film deposited with high adhesiveness on the substrate.

BEST MODE FOR CARRYING OUT THE INVENTION

Figure 1:
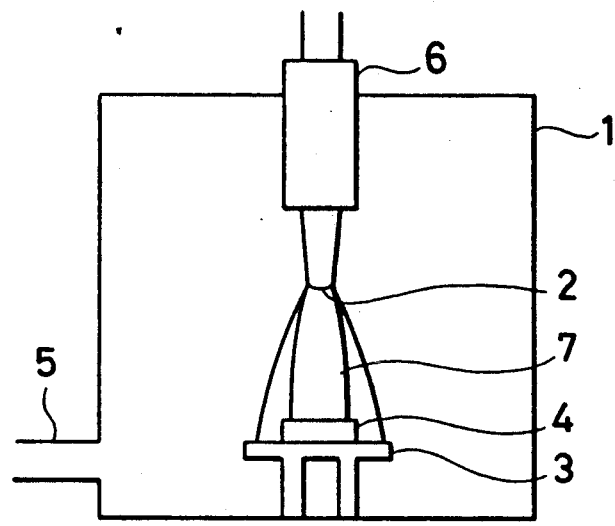
FIG. 1 represents a device used in the synthesis of diamond by the combustion flame method in Example 1.

Now, the present invention will be described in detail below.

Hard metal refers to what is obtained by sintering a carbide, nitride, boride, or silicide of a metal of Groups IV, V, or VI in the Periodic Table of Elements by the use of a binder of such a metal as Co, Ni, or Fe or an alloy thereof. The WC-Co type hard metal may be cited as a typical example.

When a substrate of such hard metal is subjected to electrolytic polishing with a pulse voltage, the surface of this substrate is melted and forms innumerable protuberances. In this case, a group of suitable protuberances is formed because Co is mainly melted and WC is also partially melted. The electrolyte to be used herein is desired to be a mineral acid such as, for example, HCl, $H_2SO_4$, or $HNO_3$. The concentration of the mineral acid may be approximately in the range of 1 to 50% and an aqueous solution of 5 to 30% by weight of HCl proves to be particularly desirable.

The aqueous solutions of NaOH and KOH and mixtures thereof with aqua ammonia are also usable. Their concentrations are approximately in the range of 1 to 50%. The current density is desired to be in the range of 0.1 to 2 $A/cm^2$. While varying with the kind of the solution, the temperature and concentration of the solution and the current density, a polishing time in the range of 1 to 20 minutes with the hard metal substrate as an anode is sufficient for obtaining innumerable protuberances.

When the frequency of the pulse voltage is increased and the pulse width thereof decreased, the protuberances formed on the surface of the hard metal substrate tend to increase in size and density. The results of the electrolysis are variable to some extent with the kind of the hard metal used and the conditions such as of the current density. When a hard metal of WC-6% Co is subjected to electrolytic polishing in an aqueous 20% HCl solution at a temperature of 20° C. and a current density of 0.5 $A/cm^2$, protuberances 2 $\mu m$ in thickness and 3 $\mu m$ in length are formed in a density of $5 \times 10^3$ pieces/$mm^2$ with a voltage applied under the conditions of $\frac{1}{2}$ Hz in frequency and 120 mS in pulse width. The protuberances 4 $\mu m$ in thickness and 6 $\mu m$ in length are produced in a density of $1 \times 10^4$ pieces/$mm^2$ when the pulse voltage is applied under the conditions of 2 Hz in frequency and 80 mS in pulse width. In the latter case, the protuberances are larger in size and density than those produced in the former case and the adhesive strength is 1.5 times the magnitude obtained in the former case using the pulse voltage $\frac{1}{2}$ Hz in frequency.

In the method of this invention, the time required for the formation of protuberances is long when the time of application of the pulse voltage is unduly short. On the other hand, when the time of application of pulse voltage is too long, the result becomes the same as in constant voltage electrolytic polishing. Further, when the frequency is unduly large, the migration of ions in the electrolytic solution falls short of the required level and no effect is obtained.

The protuberances obtained by the method of this invention are not more than 200 $\mu$m in thickness, not more than 150 $\mu$m in length, and 1 to $1 \times 10^6$ pieces/mm² in density. For the hard metal substrate to be effectively used as coated with a diamond film, the protuberances are desired to have a thickness in the range of 1 to 50 $\mu$m, a length in the range of 1 to 50 $\mu$m, and a density in the range of $1 \times 10^3$ to $1 \times 10^5$ pieces/mm². When the pulse voltage is used for the electrolytic polishing, the pulse width is in the range of 1 m.sec to 1 sec and the pulse frequency is in the range of 500 Hz to 1/10 Hz.

When diamond is formed by the vapor phase process on a hard metal substrate having the surface thereof electrolytically polished with a pulse voltage as described above, a diamond film can be deposited with extremely high adhesive strength on the surface of the substrate.

Now, the method of this invention for further performing a scratching treatment with an abrasive powder on the electrolytically polished surface of the substrate for the purpose of enhancing the adhesive strength thereof will be described below.

The method of scratching treatment is effective even when the electrolytic polishing has been carried out by the use of a constant voltage. When the surface of the substrate is subjected to the scratching treatment with an abrasive powder, the fastness of adhesion of the diamond film to be deposited thereon is heightened. The substances usable herein for the abrasive powder include diamond, cBN, $Al_2O_3$, and SiC, for example. Among the foregoing substances, diamond proves to be particularly desirable. In this case, the grinding is desired to be performed to an extent such that the protuberances already formed on the surface thereof are not lost. This grinding with the abrasive powder is effectively carried out, for example, by using so-called diamond paste, i.e. a paste containing diamond dust or by utilizing the ultrasonic vibration generated in a suspension of diamond dust or other abrasive powder in alcohol or other solution.

In consequence of this treatment, the surface of the substrate sustains innumerable scratches of a size about 1/5 of the diameter of the particles of the abrasive powder. Since diamond nuclei are generated from the sites of these scratches, the generation of nuclei proceeds uniformly and the diamond film eventually formed enjoys improvement in homogeneity, surface smoothness, and adhesive strength.

Though the pressure with which the hard metal substrate is ground with the abrasive powder such as of diamond dust is variable with the material of the hard metal substrate and the time of the electrolytic polishing, a very small pressure not exceeding 5 kg/cm² generally suffices for the grinding. The abrasive powder such as diamond dust is desired to be approximately in the range of 0.5 to 10 $\mu$m, preferably 1 to 5 $\mu$m.

When the electrolytic polishing of the aforementioned substrate is carried out by the use of the constant voltage, the conditions to be used are substantially identical with those used for the electrolytic polishing using the pulse voltage. In this case, protuberances are formed on the surface of the substrate. When a diamond film is formed on the substrate having the above-mentioned surface condition, however, the protuberances form the sites for the generation of nuclei and the diamond film consequently formed lacks uniformity and is deficient in adhesive strength.

By combining the electrolytic polishing with the scratching treatment as mentioned above, however, the diamond film can be formed homogeneously with high fastness of adhesion.

When the hard metal substrate treated as described above is set in place in a region for the formation of diamond by the vapor phase process and then subjected to the process, a diamond film rich in density and adhesive strength is deposited on the substrate.

This process is particularly suitable for the combustion flame process which comprises blowing the flame of the gas of a raw material for diamond against the substrate with the aid of a burner. In this combustion flame process, the substrate is desired to be set within the region of incomplete combustion in the combustion flame.

When a hard metal having undergone the surface treatment as described above is used as a substrate and a diamond film synthesized by the vapor phase process is formed on the substrate, the protuberances and the scratches inflicted by the abrasive powder allow the surface of the diamond film to acquire an increased surface area for contact with the substrate. Owing to the anchoring effect of the surface ruggedness, the diamond film adheres powerfully to the substrate.

Now, the present invention will be described more specifically below with reference to working examples and comparative experiments.

EXAMPLE 1

In an aqueous 10% HCl solution, electrolytic polishing was performed with a substrate (12 mm $\times$ 12 mm $\times$ 2 mm) of a WC hard metal containing 6% of Co as an anode and a carbon bar as a cathode. The voltage was 3 V, the current 0.5 A, and the polishing time 5 minutes. Since the surface of the hard metal substrate was covered with an oxide after the electrolytic polishing, it was washed with an aqueous 10% NaOH solution. On observation the washed surface was found to be formed with protuberances 3 $\mu$m in thickness, 5 $\mu$m in length, and $3 \times 10^3$ pieces/mm² in density. The surface of the hard metal substrate was subjected to a scratching treatment with a paste containing diamond particles 1 $\mu$m in diameter, washed with alcohol, and subjected to synthesis of a diamond film. For this synthesis, the combustion flame process depicted in FIG. 1 was used. The reaction furnace 1 measured 35 cm in diameter, 50 cm in height, and 48 liters in inner volume.

This reaction furnace 1 was provided in the upper part thereof with a burner 6 incorporating therein a flame inlet 2 and in the lateral part thereof with an exhaust pipe. A water cooling base 3 was set below the flame inlet 2 and a hard metal substrate 4 was placed on the water cooling base 3. The distance between the flame inlet 2 and the substrate 4 was 1 cm.

The inner pressure of the reaction furnace was fixed at 300 Torrs. By feeding acetylene gas at a flow rate of 5 liters/min and oxygen gas at a flow rate of 4.5 liters/min to the flame inlet, a diamond film was synthesized for 30 minutes within the region 7 of incomplete combustion. After that, to determine the adhesive strength between the substrate and the diamond film, a Rockwell pressing piece of diamond having a tip of a spherical surface 0.2 mm in radius and an apical angle of 120° was forced into the diamond film and the load required for the pressing piece to separate this film from the substrate was measured. As a result, this load was found to be 20 kg.

COMPARATIVE EXPERIMENT 1

The same substrate as used in Example was subjected to electrolytic polishing in an aqueous HCl solution under the same conditions. The oxide formed on the surface of the substrate was removed with an aqueous NaOH solution. Then, the substrate was subjected to synthesis of a diamond film without undergoing a scratching treatment using a diamond paste. The method of diamond synthesis and the conditions used therefor were the same as those in Example. The synthesized diamond film on observation was found to have a notably jagged surface as compared with the diamond film obtained in Example 1 and revealed the underlying hard metal substrate at a few points. In the same test for adhesive strength as in Example, the load required for the separation of the diamond film was 5 kg.

COMPARATIVE EXPERIMENT 2

The same substrate as used in Example was subjected, without undergoing an electrolytic polishing, to a surface scratching treatment with a paste of diamond particles 1 μm in diameter and then subjected to synthesis of diamond film. The method of this synthesis and the conditions therefor were identical with those of Example 1. After synthesis, the synthesized diamond film was found to be already separated from the substrate.

EXAMPLE 2

Figure 2:
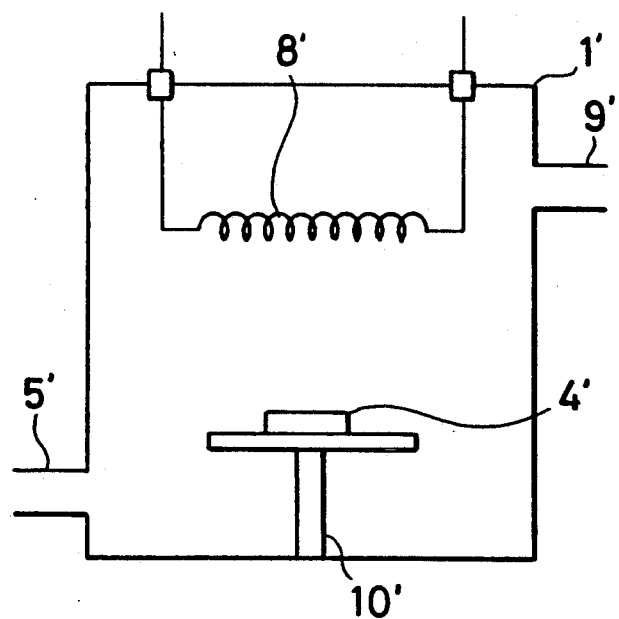
FIG. 2 represents a device used in the synthesis of diamond by the hot filament method in Examples 2 and 3.

On the hard metal substrate which had undergone the same surface treatment as in Example 1, a diamond film was synthesized by the hot filament process. FIG. 2 is a diagram illustrating a device used for this synthesis. The reaction furnace 1 measured 15 cm in diameter, 30 cm in length and 5 liters in inner volume. It was provided therein with a hot filament 8' as a source of excitation, a hard metal substrate 4', and a substrate supporting base 10'. Denoted by 9' is a raw gas feeding pipe and 5' an exhaust pipe.

In this device, a diamond was synthesized by using a feed gas consisting of hydrogen fed at 100 cc/min and ethanol at 3 cc/min, keeping the temperature of the hot filament at 2450° C., maintaining a distance of 5 mm between the substrate and the filament, and setting the inner pressure at 90 Torrs. In the same test for adhesive strength as in Example, the load required for separation of the synthesized diamond film was found to be 16 kg.

EXAMPLE 3

In an aqueous 10% HCl solution as an electrolytic solution using a substrate (12 mm × 12 mm × 2 mm) of a WC hard metal containing 6% of Co as an anode and a carbon bar as a cathode, electrolytic polishing was performed for 30 minutes under the conditions of 3 V in voltage, 0.5 A in current, ½ Hz in pulse frequency, and 120 mS in pulse width. Since the surface of the hard metal substrate resulting from the electrolytic polishing was covered with an oxide, it was washed with an aqueous 10% NaOH solution for removal of the oxide. Then, the surface of the substrate was subjected to a scratching treatment with a paste containing diamond particles 1 μm in average diameter and then washed with alcohol. Then, on the substrate resulting from the treatment mentioned above, diamond was deposited by the hot filament process using a device constructed as illustrated in FIG. 2. The reaction furnace used in this example measured 25 cm in diameter and 20 cm in height. The distance between the substrate and the hot filament was 5 mm. As raw materials, gasified ethanol was fed at 3 cc/min and hydrogen at 100 cc/min through a feed inlet 5' into the reaction furnace. Under these conditions, the reaction for deposition of diamond was continued for 3 hours under a pressure of 90 Torrs. Consequently, a diamond film 15 μm in average thickness was deposited on the substrate. The diamond was identified by observation under an optical microscope and analysis with a Raman spectroscope.

Then, to determine the adhesive strength of the diamond film to the substrate, a Rockwell pressing piece of diamond having a tip of a spherical surface 0.2 mm in radius and an apical angle of 120° was forced into the diamond film and the load required for the pressing piece to separate this film from the substrate was measured. Consequently, this load was found to be 25 kg.

EXAMPLE 4

A diamond film was formed on a hard metal substrate treated in entirely the same manner as in Example 3, except that a constant voltage was used in place of the pulse voltage. The load required for the separation of the diamond film from the substrate was measured in the same manner as in Example. The load was found to be 12 kg.

EXAMPLE 5

The same substrate as used in Example 3 was subjected to electrolytic polishing using a pulse voltage under the same conditions. On the substrate resulting from this electrolytic polishing, a diamond film was synthesized without scratching treatment using a paste containing diamond.

The synthesis was performed by the hot filament CVD process under the same conditions as in Example 3. When the deposited diamond film was observed after synthesis, it was found to contain a somewhat larger number of recesses and protuberances than the diamond film deposited in Example 3. The load required for the separation of this diamond film was 9 kg.

EXAMPLE 6

The same substrate as used in Example 3 was subjected to electrolytic polishing using a pulse voltage under the same conditions. The substrate was then subjected to a scratching treatment using a diamond paste in the same manner as in Example 3. For the synthesis of a diamond film, the combustion flame process was carried out under the same conditions as in Example 1.

The diamond film resulting from the synthesis, on observation, was found to have a thickness of about 20 μm and possess high surface smoothness. In the test for adhesive strength performed in the same manner as in Example 3, the load required for the separation of the diamond film was found to be 27 kg.

Industrial Applicability

In accordance with this invention, a diamond film can be deposited with extremely high adhesive strength on a hard metal substrate and a tool furnished with a diamond film capable of enduring harsh working conditions can be manufactured.

We claim:

1. A method for the vapor phase synthesis of diamond on an electrochemically treated substrate, which method comprises a step of electrolytically polishing a hard metal substrate by the use of a pulse voltage thereby causing formation of a group of protuberances on the surface thereof and heightening the adhesive force of the surface thereof and a step of depositing dense diamond of high adhesive strength on said substrate by a vapor phase process.

2. A method for the vapor phase synthesis of diamond on an electrochemically treated substrate according to claim 1, wherein said pulse voltage has a pulse width in the range of 1 m.sec to 1 sec and a pulse frequency in the range of 500 Hz to 1/10 Hz.

3. A method for the vapor phase synthesis of diamond on an electrochemically treated substrate according to claim 1, wherein an electrolytic solution used for said electrolytic polishing is a mineral acid.

4. A method for the vapor phase synthesis of diamond on an electrochemically treated substrate according to claim 3, wherein said mineral acid is hydrochloric acid and said hydrochloric acid is an aqueous 5 to 30% hydrochloric acid solution.

5. A method for the vapor phase synthesis of diamond on an electrochemically treated substrate according to claim 1, wherein said protuberances have a length in the range of 1 to 50 $\mu$m, a thickness in the range of 1 to 50 $\mu$m, and a maximum density in the range of $1 \times 10^3$ to $1 \times 10^5$ pieces/mm$^2$.

6. A method for the vapor phase synthesis of diamond on an electrochemically treated substrate according to claim 1, wherein said vapor phase process is a combustion flame process and said substrate is disposed in a diamond forming region thereof.

7. A method for the vapor phase synthesis of diamond on an electrochemically treated substrate according to claim 6, wherein said diamond forming region is in the region for incomplete combustion in the combustion flame.

8. A method for the vapor phase synthesis of diamond on an electrochemically treated substrate according to claim 1, wherein said step for heightening the adhesive force of the substrate surface includes a scratching treatment with an abrasive powder performed subsequently to the formation of said group of protuberances on said substrate surface by the electrolytic polishing.

9. A method for the vapor phase synthesis of diamond on an electrochemically treated substrate according to claim 8, wherein said abrasive powder used for said scratching treatment is the powder of at least one member selected from the group consisting of diamond, cBN, $Al_2O_3$, and SiC.

10. A method for the vapor phase synthesis of diamond on an electrochemically treated substrate according to claim 9, wherein said scratching treatment comprises forming a paste of said abrasive powder and grinding the electrolytically polished surface with said paste.

11. A method for the vapor phase synthesis of diamond on an electrochemically treated substrate according to claim 10, wherein said abrasive powder is diamond and said paste is a diamond paste.

12. A method for the vapor phase synthesis of diamond on an electrochemically treated substrate according to claim 9, wherein said scratching treatment is carried out by immersing said electrolytically treated substrate in a solution suspending said abrasive powder and imparting ultrasonic vibration to said suspension.

13. A method for the vapor phase synthesis of diamond on an electrochemically treated substrate according to claim 12, wherein said substrate is immersed in a suspension of said diamond abrasive powder in alcohol and said suspension is subjected to ultrasonic vibration.

14. A method for the vapor phase synthesis of diamond on an electrochemically treated substrate, which method comprises a step of electrolytically polishing a hard metal substrate by the use of a constant voltage and then performing thereon a scratching treatment with an abrasive powder thereby causing formation of a group of protuberances on the surface thereof and heightening the adhesive force of the surface thereof and a step of depositing dense diamond of high adhesive strength on said substrate by a vapor phase process.

15. A method for the vapor phase synthesis of diamond on an electrochemically treated substrate according to claim 14, wherein an electrolytic solution used for said electrolytic polishing is a mineral acid.

16. A method for the vapor phase synthesis of diamond on an electrochemically treated substrate according to claim 15, wherein said mineral acid is hydrochloric acid and said hydrochloric acid is an aqueous 5 to 30% hydrochloric acid solution.

17. A method for the vapor phase synthesis of diamond on an electrochemically treated substrate according to claim 14, wherein said protuberances have a length in the range of 1 to 50 $\mu$m, a thickness in the range of 1 to 50 $\mu$m, and a maximum density in the range of $1 \times 10^3$ to $1 \times 10^5$ pieces/mm$^2$.

18. A method for the vapor phase synthesis of diamond on an electrochemically treated substrate according to claim 14, wherein said vapor phase process is a combustion flame process and said substrate is disposed in a diamond forming region thereof.

19. A method for the vapor phase synthesis of diamond on an electrochemically treated substrate according to claim 18, wherein said diamond forming region is in the region for incomplete combustion in the combustion flame.

* * * * *